(12) United States Patent
Jeon et al.

(10) Patent No.: US 12,557,261 B2
(45) Date of Patent: Feb. 17, 2026

(54) FABRICATING EQUIPMENT FOR SEMICONDUCTOR DEVICE AND METHOD FOR FABRICATING SEMICONDUCTOR DEVICE

(71) Applicant: Samsung Electronics Co., Ltd., Suwon-si (KR)

(72) Inventors: Intak Jeon, Seoul (KR); Han Jin Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 640 days.

(21) Appl. No.: 17/964,998

(22) Filed: Oct. 13, 2022

(65) Prior Publication Data
US 2023/0225102 A1 Jul. 13, 2023

(30) Foreign Application Priority Data
Jan. 10, 2022 (KR) .......... 10-2022-0003087

(51) Int. Cl.
*H10B 12/00* (2023.01)
*B05D 3/00* (2006.01)
*B05D 3/06* (2006.01)
*B05D 5/12* (2006.01)
*C23C 14/02* (2006.01)
*C23C 14/04* (2006.01)
(Continued)

(52) U.S. Cl.
CPC ............. *H10B 12/03* (2023.02); *B05D 3/062* (2013.01); *B05D 3/207* (2013.01); *B05D 5/12* (2013.01); *B05D 2350/00* (2013.01); *C23C 14/022* (2013.01); *C23C 14/048* (2013.01); *C23C 16/0209* (2013.01); *C23C 16/047* (2013.01); *C23C 16/481* (2013.01); *C23C 18/04* (2013.01)

(58) Field of Classification Search
CPC ........ H10B 12/03; B05D 3/062; B05D 3/207; B05D 5/12; B05D 2350/00; C23C 14/022; C23C 14/048; C23C 16/0209; C23C 16/047; C23C 16/46; C23C 16/481; C23C 18/04
USPC .................. 427/255.15, 98.5, 255.1
See application file for complete search history.

(56) References Cited

U.S. PATENT DOCUMENTS 5,141,602 A * 8/1992 Chen ............... H01L 21/485
                                                    204/230.6
5,296,255 A * 3/1994 Gland .............. C23C 16/04
                                                    427/255.18
(Continued)

FOREIGN PATENT DOCUMENTS

KR 10-2007-0105929 A 10/2007
KR 10-2009-0059568 A 6/2009
(Continued)

*Primary Examiner* — Brian K Talbot
(74) *Attorney, Agent, or Firm* — Muir Patent Law, PLLC

(57) ABSTRACT

A fabricating equipment and method for a semiconductor device is provided. The fabricating equipment comprises a process chamber including an internal space, a substrate support which supports a substrate including a first film and a second film, inside the internal space, a nozzle which is placed on the substrate support and supplies a process gas, a first heater which is placed inside the substrate support and heats the substrate and a second heater which generates one of waves of a first frequency and waves of a second frequency to differentially heat the first film and the second film.

16 Claims, 17 Drawing Sheets

(51) Int. Cl.
  *C23C 16/02* (2006.01)
  *C23C 16/04* (2006.01)
  *C23C 16/48* (2006.01)
  *C23C 18/04* (2006.01)

(56) References Cited

U.S. PATENT DOCUMENTS

| | | | |
|---|---|---|---|
| 8,192,809 B2 * | 6/2012 | Gaitas | B82Y 30/00 |
| | | | 427/591 |
| 9,512,519 B2 | 12/2016 | Chuang et al. | |
| 9,583,354 B2 * | 2/2017 | Abraham | B81B 3/0021 |
| 9,679,779 B2 * | 6/2017 | Taylor | C23C 16/481 |
| 10,163,732 B2 | 12/2018 | Hung | |
| 10,403,504 B2 * | 9/2019 | Longrie | C23C 16/08 |
| 10,655,226 B2 | 5/2020 | Wilson et al. | |
| 12,209,305 B2 * | 1/2025 | Mattinen | C23C 16/04 |
| 2012/0248460 A1 * | 10/2012 | Abraham | C23C 16/18 |
| | | | 257/77 |
| 2020/0318236 A1 * | 10/2020 | Arkles | C23C 16/16 |

FOREIGN PATENT DOCUMENTS

| | | |
|---|---|---|
| KR | 10-2015-0094075 A | 8/2015 |
| KR | 10-2018-0080075 A | 7/2018 |
| KR | 10-2027776 B1 | 11/2019 |

* cited by examiner

FIG. 1
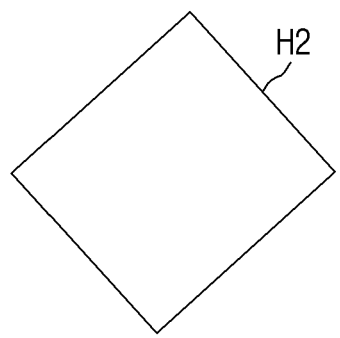
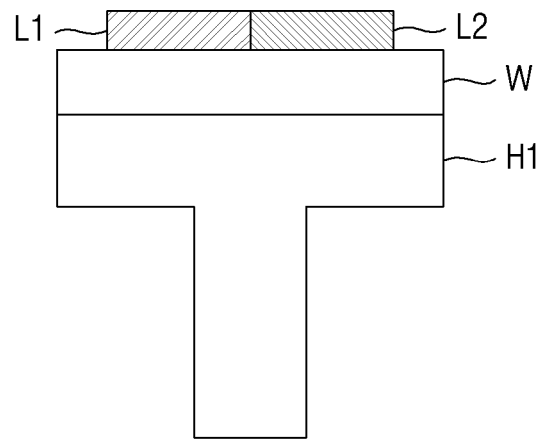

FABRICATING EQUIPMENT FOR SEMICONDUCTOR DEVICE AND METHOD FOR FABRICATING SEMICONDUCTOR DEVICE

CROSS-REFERENCE TO RELATED APPLICATION

This application claims priority under 35 U.S.C. 119 to Korean Patent Application No. 10-2022-0003087 filed on Jan. 10, 2022 in the Korean Intellectual Property Office, the contents of which in its entirety are herein incorporated by reference.

BACKGROUND

1. Field of the Invention

The present invention relates to fabricating equipment for a semiconductor device and a method for fabricating the semiconductor device.

2. Description of the Related Art

In recent years, as high integration of memory products has accelerated with rapid development of miniaturized semiconductor process technology, a unit cell area has been greatly reduced, and an operating voltage has been lowered. For example, in a semiconductor element such as a DRAM, an area occupied by the element decreases as the degree of integration increases, on the other hand, the required capacitance is maintained or increased. As the required capacitance increases, an aspect ratio of cylinder type lower electrodes greatly increases.

An atomic layer deposition is a technique for forming a thin film on a semiconductor substrate, and may be used for forming a lower electrode of a semiconductor element having a large aspect ratio. The atomic layer deposition may form the thin film on the substrate, using a precursor and a reaction gas. Because the atomic layer deposition, which is highly dependent on the characteristics of the precursor, has low material-specific selectivity, etching and cleaning processes after vapor deposition are typically required.

SUMMARY

Aspects of the present invention provide fabricating equipment for a semiconductor device having improved efficiency.

Aspects of the present invention also provide a method for fabricating the semiconductor device having improved efficiency.

According to some aspects of the present inventive concept, fabricating equipment for a semiconductor device includes a process chamber including an internal space, a first substrate support configured to support a first substrate inside the internal space, the first substrate including a first film and a second film having different dielectric loss distributions with respect to a frequency, a nozzle configured to supply a process gas to the internal space, a first heater which is placed below the first substrate and heats the first substrate, and a second heater which generates waves, which when propagated toward the substrate, and differentially heat the first film of the first substrate and the second film of the first substrate.

According to some aspects of the present inventive concept, fabricating equipment for a semiconductor device includes a process chamber including an internal space, a substrate support which supports a substrate inside the internal space, the substrate having a first film and a second film formed thereon, a nozzle which is placed on the substrate support and supplies a process gas, a first heater which is placed inside the substrate support and heats the substrate, and a second heater configured to selectively generate one of waves of a first frequency and waves of a second frequency to differentially heat the first film and the second film.

According to some aspects of the present inventive concept, a method for fabricating a semiconductor device includes providing a substrate on which a first layer having a maximum dielectric loss value at a first frequency, and a second layer having a maximum dielectric loss value at a second frequency different from the first frequency are formed, providing waves of the first frequency from a heater to the substrate to heat a temperature of the first layer to be higher than the temperature of the second layer and while the temperature of the first layer is higher than the temperature of the second layer, forming a third layer, which is thinner than the first layer and is thinner than the second layer, on the heated first layer and not on the second layer.

According to some aspects of the present inventive concept, a method for fabricating a semiconductor device uses temperature-dependent selective deposition in a process chamber including an internal space, a first heater, and a second heater, and includes providing a substrate on a substrate support in the process chamber, forming a first integrated circuit component on the substrate, the first integrated circuit component formed of a first material, forming a second integrated circuit component on the substrate, the second integrated circuit component formed of a second material, applying heat from the first heater to the first integrated circuit component and second integrated circuit component simultaneously, providing at least one of an electromagnetic wave and a magnetic field from the second heater to the first integrated circuit component and the second integrated circuit component simultaneously, to heat a temperature of the first integrated circuit component to be higher than the temperature of the second integrated circuit component, and depositing a layer on the first integrated circuit component having the higher temperature.

According to some aspects of the inventive concept, a method for fabricating a semiconductor device by using temperature-dependent selective deposition in a process chamber including an internal space and a heater includes providing a substrate on a substrate support in the process chamber, forming a first integrated circuit component on the substrate and a second integrated circuit component on the substrate, providing at least one of an electromagnetic wave and a magnetic field from the heater to the first integrated circuit component and the second integrated circuit component simultaneously, to heat a temperature of the first integrated circuit component to be higher than the temperature of the second integrated circuit component, and using a process gas, depositing a layer on the first integrated circuit component having the higher temperature.

However, aspects of the present invention are not restricted to the ones set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present disclosure will become more apparent by describing in detail exemplary embodiments thereof with reference to the attached drawings, in which:

FIG. 1 is an exemplary diagram for explaining a concept in which a heater partially heats a substrate in the fabricating equipment for the semiconductor device according to some embodiments.

DETAILED DESCRIPTION OF THE EMBODIMENTS

Hereinafter, embodiments according to the technical idea of the present invention will be described referring to the accompanying drawings. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 2:
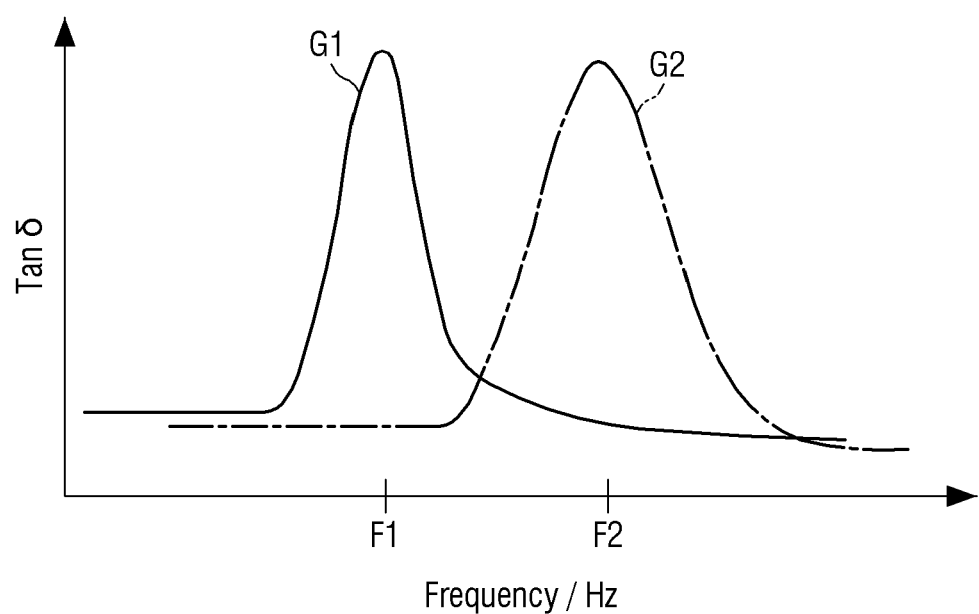
FIG. 2 is a graph showing dielectric loss values of a first film and a second film with respect to a frequency of waves.

FIG. 1 is an exemplary diagram for explaining a concept in which a heater partially heats a substrate in the fabricating equipment for the semiconductor device according to some embodiments. FIG. 2 is a graph showing dielectric loss values of a first film and a second film with respect to a frequency of waves.

Referring to FIG. 1, a substrate W may include a first film L1 and a second film L2 formed thereon. Specifically, the first film L1 and the second film L2 may be placed on the substrate W. The first film L1 and the second film L2 may each include different materials from each other. In some embodiments, the first film L1 and the second film L2 may include or be formed of one of a semiconductor material, an insulating material (e.g., an insulating layer), and a conductive material, each of which is different from each other. For example, the first film L1 may include be formed of a conductive material (e.g., electrically conductive material), and the second film L2 may include or be formed of an insulating material without including a conductive material. As another example, the first film L1 may include or be formed of a semiconductor material, and the second film L2 may include or be formed of a conductive material without including a semiconductor material. As depicted in FIG. 1, the first film L1 and second film L2 may be disposed side-by-side, e.g., at the same vertical level or height above the substrate W. The first film L1 may be described as a first layer, and the second film L2 may be described as a second layer, which first and second layer may be at the same vertical level as each other. Alternatively, the first film L1 and second film L2 may be at different vertical levels, or may be partly at the same vertical level and partly at different vertical levels, and may comprise different components of a device being formed.

The substrate W may be placed on a first heater H1. The first heater H1 may provide heat energy to the substrate W below the substrate W. The first heater H1 may generally heat the substrate W. The first heater H1 may uniformly heat both the first film L1 and the second film L2 on the substrate W. The first heater H1 may heat the substrate W, using a Joule heating method. For example, the first heater H1 may change the temperature of the substrate W, using the Joule heating method.

Although FIG. 1 shows that the first heater H1 is placed below the substrate W, the embodiment is not limited thereto. For example, the first heater H1 may be placed above the substrate W.

The second heater H2 may be placed apart from the substrate W. For example, the second heater H2 may be placed above the substrate W. The second heater H2 may provide a wave energy to the substrate W, by propagating waves (e.g., electromagnetic waves) toward the substrate. For example, the second heater H2 may provide light to the substrate W (e.g., light having a frequency between 10 Hz and $10^{10}$ Hz). That is, the second heater H2 may change the temperature of the substrate W by utilizing the wave energy.

The second heater H2 may partially heat the substrate W. For example, the second heater H2 may heat the first film L1 more strongly than the second film L2 on the substrate W. As another example, the second heater H2 may heat the second film L2 more strongly than the first film L1 on the substrate W. That is, the second heater H2 may differentially heat the first film L1 and the second film L2.

Specifically, the second heater H2 generates and provides the same wave energy to the first film L1 and the second film L2, and because in some embodiments (e.g., when formed of different materials) the reactivity of the first film L1 and the second film L2 for the same wave energy differs, the temperature of the second film L2 may be changed to be different from that of the first film L1.

Although FIG. 1 shows that the second heater H2 is obliquely placed above the substrate W, this is simply shown for the sake of explanation, and the embodiment is not limited thereto. The position at which the second heater H2 is placed may be variously changed depending on the embodiment, and may be, for example, directly above the substrate W. In addition, the second heater H2 may include a plurality of elements, e.g., a plurality of heater units (e.g., light sources), placed and spaced apart from each other above a first substrate support (described in greater depth below). Also, these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Referring to FIG. 2, a first graph G1 and a second graph G2 show a loss tangent value tan δ with respect to the frequency of the wave. The loss tangent refers to a measure by which the wave energy propagating in a medium is lost by a thermal energy. Hereinafter, the loss tangent will be described while being referred to as a dielectric loss value (e.g., even for a film that is not a dielectric material).

The first graph G1 shows the dielectric loss value of the first film L1 with respect to the frequency of the wave. Referring to the first graph G1, the first film L1 has a maximum dielectric loss value at a first frequency F1. On the other hand, at the first frequency F1, the dielectric loss value of the second film L2 is lower than that of the first film L1.

The second graph G2 shows the dielectric loss value of the second film L2 with respect to the frequency of the wave. Referring to the second graph G2, the second film L2 has a maximum dielectric loss value at a second frequency F2. On the other hand, at the second frequency F2, the dielectric loss value of the first film L1 is lower than that of the second film L2.

That is, the first film L1 and the second film L2 may have different distributions of dielectric loss values according to the frequency of the wave. The first film L1 and the second film L2 may have different dielectric loss values for waves of the same frequency. This may be due to the fact that the first film L1 and the second film L2 include materials different from each other. As a result, when waves of the same frequency are applied to the first film L1 and the second film L2, the degree of changed thermal energy of the first film L1 and the second film L2 may differ.

FIGS. 3 to 8 are exemplary diagrams for explaining the operation of the fabricating equipment for the semiconductor device according to some embodiments.

Figure 3:
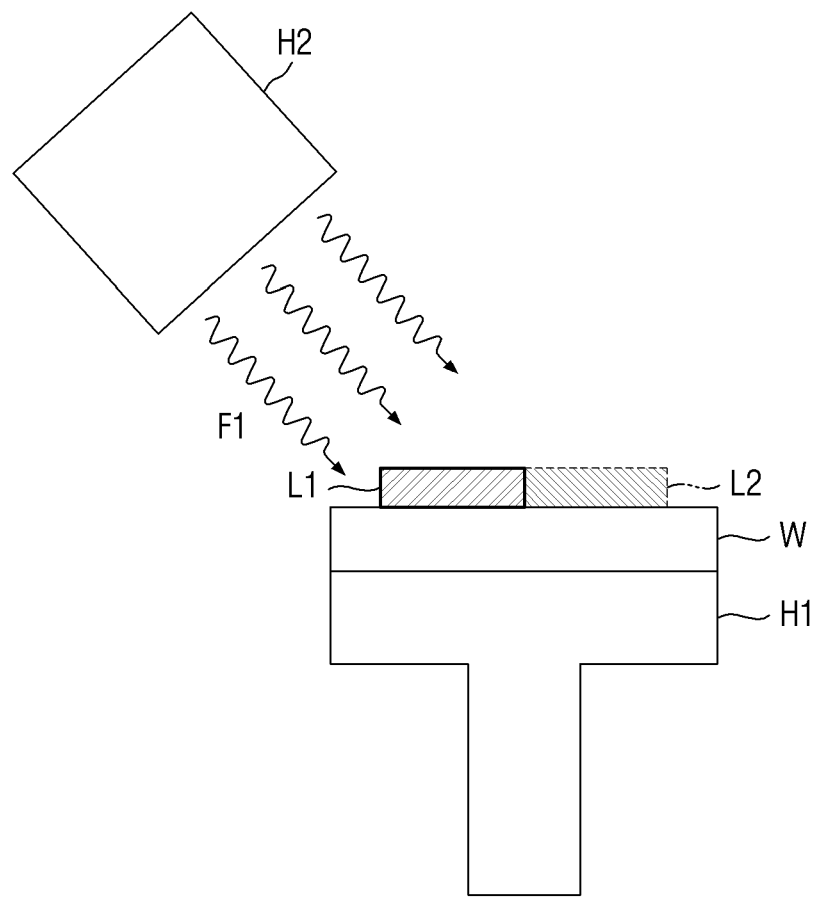
FIGS. 3 to 8 are exemplary diagrams for explaining the operation of the fabricating equipment for the semiconductor device according to some embodiments.
Figure 4:
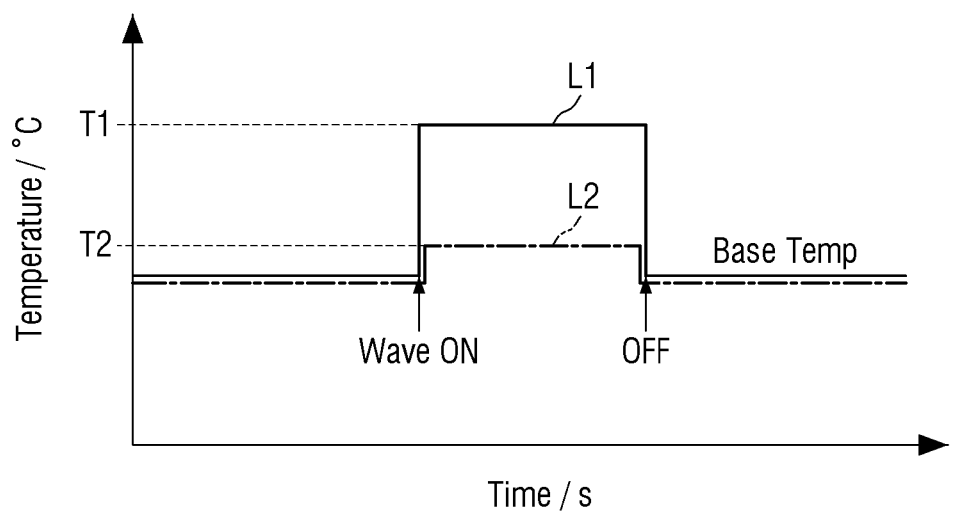

Referring to FIGS. 2, 3 and 4, the second heater H2 provides the substrate W with waves of the first frequency F1. The dielectric loss value of the first film L1 with respect to the first frequency F1 is relatively higher than the dielectric loss value of the second film L2 with respect to the first frequency F1. The dielectric loss value of the second film L2 with respect to the first frequency F1 is relatively lower than the dielectric loss value of the first film L1 with respect to the first frequency F1. Therefore, since the value of wave energy that is lost by thermal energy is larger in the first film L1 than in the second film L2, the temperature change (e.g., increase) of the first film L1 is greater than the temperature change (e.g., increase) of the second film L2. When providing the wave of the first frequency F1, the first film L1 rises to the first temperature T1 higher than the second temperature T2, and the second film L2 rises to the second temperature T2 lower than the first temperature T1.

Figure 5:
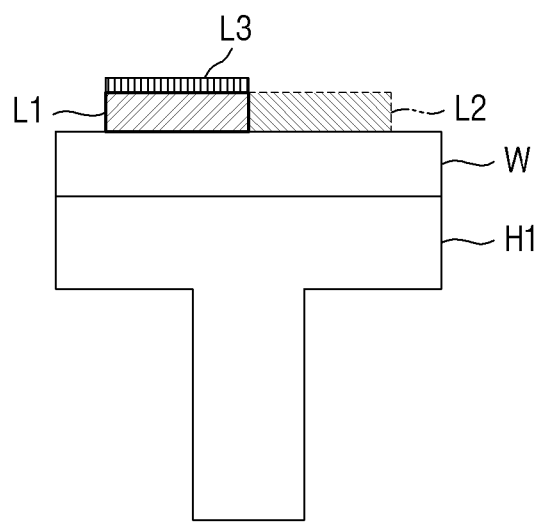

Referring to FIG. 5, a third film L3 may be deposited on the first film L1 which has a higher temperature than the second film L2. Specifically, the third film L3 is not deposited on the second film L2 which has a lower temperature than that of the first film L1, and the third film L3 is deposited on the first film L1 which has a higher temperature than that of the second film L2. For example, since the temperatures of the first film L1 and the second film L2 are different from each other, the third film L3 may be selectively deposited only on the first film L1. The third film L3 may be an integrated circuit component formed of a third material, which may include the same or different material from the material that forms the first film L1 and/or the material that forms the second film L2. This type of deposition may be described as temperature-dependent selective deposition.

Figure 6:
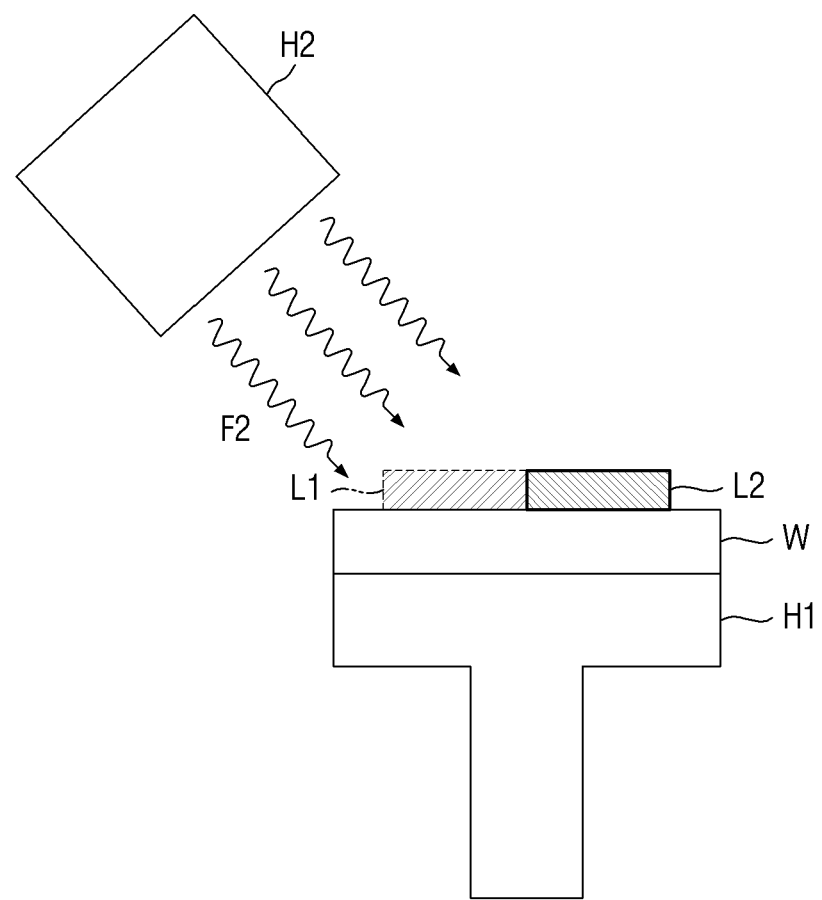
Figure 7:
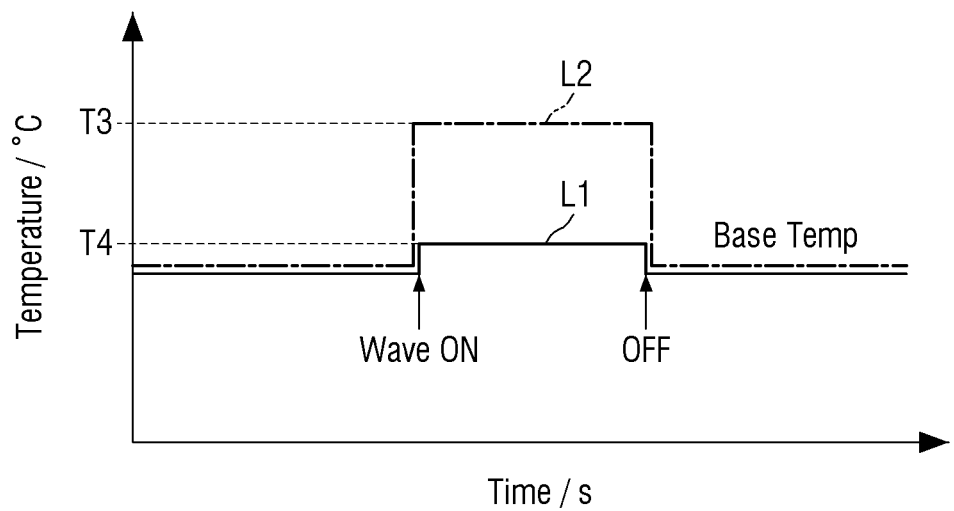

Referring to FIGS. 2, 6 and 7, the second heater H2 provides the substrate W with waves of the second frequency F2. The second heater H2 is configured to selectively generate waves of the first frequency F1 and waves of the second frequency F2 (e.g., it may be controlled to change an output wavelength or color of light). The dielectric loss value of the first film L1 with respect to the second frequency F2 is relatively lower than the dielectric loss value of the second film L2 with respect to the second frequency F2. The dielectric loss value of the second film L2 with respect to the second frequency F2 is relatively higher than the dielectric loss value of the first film L1 with respect to the second frequency F2. Therefore, since the value of wave energy which is lost by thermal energy is greater in the second film L2 than in the first film L1, the temperature change (e.g., increase) of the second film L2 is greater than the temperature change (e.g., increase) of the first film L1. When waves of the second frequency F2 are provided, the second film L2 rises to a third temperature T3 higher than the fourth temperature T4, and the first film L1 rises to the fourth temperature T4 lower than the third temperature T3.

Figure 8:
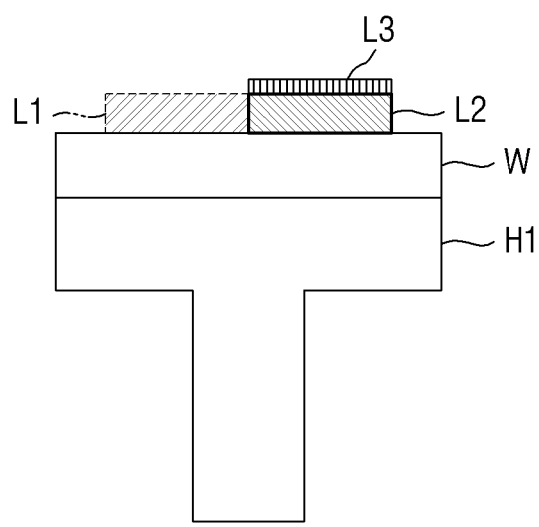

Referring to FIG. 8, the third film L3 may be deposited on the second film L2, which has a higher temperature than the first film L1. Specifically, the third film L3 is not deposited on the first film L1 having a lower temperature than that of the second film L2, and the third film L3 is deposited on the second film L2 having a higher temperature than that of the first film L1. For example, since the temperatures of the first film L1 and the second film L2 are different from each other, the third film L3 may be selectively deposited only on the second film L2, using temperature-dependent selective deposition.

As described referring to FIGS. 3 to 8, the second heater H2 may change the frequency of the wave to be generated. Although not shown in FIGS. 3 and 6, a processor for controlling the second heater H2 may control the second heater H2 to change the frequency of the wave generated. The second heater H2 may generate waves of a frequency required when selectively heating the first film L1 and the second film L2 according to the control of the processor, and provide the waves to the substrate W. The processor may be part of a control system implemented using the processor, along with control software, hardware, memory, input/output devices, and the like. For example, the processor may be part of a computer used to control the first heater H1 and second heater H2 as well as additional equipment used for processing the substrate W.

Although FIGS. 4 and 7 show that the base temperatures of the first film L1 and the second film L2 are the same, the embodiments are not limited thereto. In addition, although FIGS. 4 and 7 show that the temperatures of the first film L1 and the second film L2 rise at the same time point and decrease at the same time point, this is a simplified graph for convenience of explanation, and the embodiment is not limited thereto.

Figure 9:
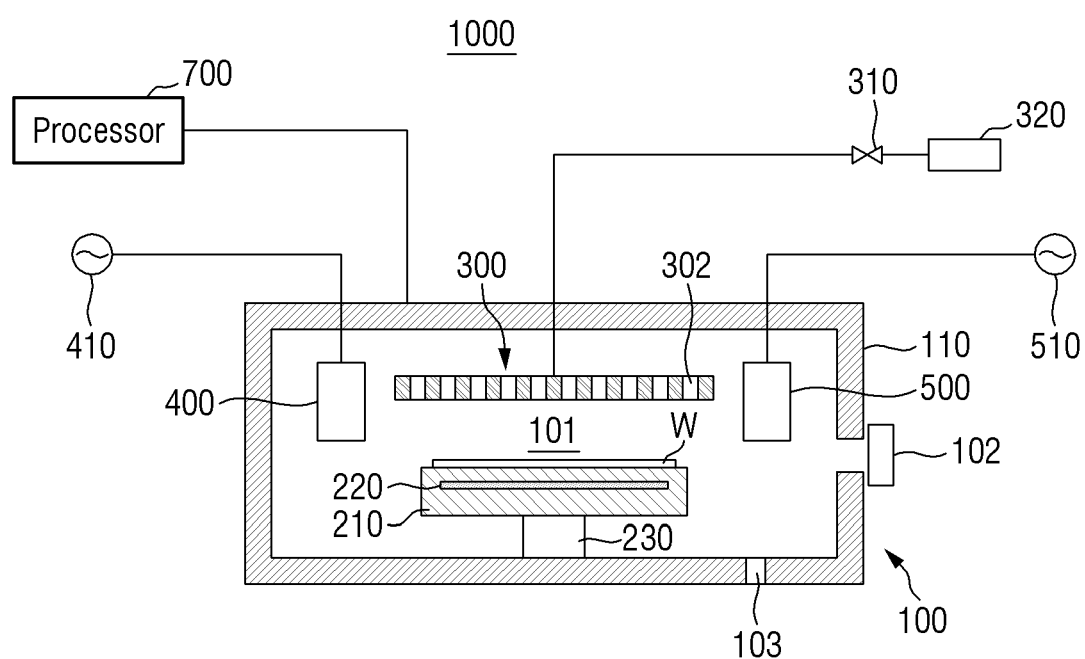
FIG. 9 is a diagram which shows the fabricating equipment for the semiconductor device according to some embodiments.

FIG. 9 is a diagram which shows the fabricating equipment for the semiconductor device according to some embodiments.

Referring to FIG. 9, a semiconductor device fabricating equipment 1000 may include a process chamber 100, a substrate support 210, a first heater 220, a nozzle 300, a second heater 400, and a third heater 500.

The process chamber 100 may provide an internal space 101. The internal space 101 is provided as a space in which the process on the substrate W is performed. The process chamber 100 includes an outer wall 110.

An exhaust hole 103 may be placed on a bottom surface of the process chamber 100. The exhaust hole 103 is connected to the exhaust line. The internal pressure of the process chamber 100 may be adjusted by the exhaust through the exhaust hole 103. Further, the reaction by-products generated during the process and the gas remaining inside the process chamber 100 may discharged to the outside through the exhaust holes 103.

Although the exhaust hole 103 is shown to be placed on the bottom surface of the process chamber 100 in FIG. 9, the embodiment is not limited thereto. For example, the exhaust hole 103 may be placed on the side surface of the process chamber 100.

A door 102 may be formed on a side wall of the process chamber 100. The door 102 may open and close an entrance through which the substrate W provided on the side wall of the process chamber 100 enters and exits.

The substrate support 210 supports the substrate W in the internal space 101. The substrate support 210 may include a first heater 220 inside. The substrate support 210 may be connected to a support shaft 230.

The substrate support 210 may be provided as a disk having a predetermined thickness and having a radius larger than that of the substrate W. The substrate W may be placed on an upper surface of the substrate support 210. The substrate W may be provided to the process in a state of being placed on the upper surface of the substrate support 210. For example, the substrate support 210 may be provided as an electrostatic chuck that fixes the substrate W by utilizing electrostatic force. As another example, the substrate support 210 may be provided as a chuck for fixing the substrate W by a mechanical clamping method. The substrate support 210 may be described as a substrate support plate.

The first heater 220 may be placed inside the substrate support 210. The first heater 220 may be provided as a spiral coil and embedded inside the substrate support 210 at uniform intervals. The first heater 220 may be connected to an external power source to generate heat. The generated heat is transferred to the substrate W via the substrate support 210, and heats the substrate W to a predetermined temperature. The first heater 220 may provide heat energy to the substrate W, using a first heating method such as a Joule heating method. The first heater 220 may be substantially the same as the first heater H1 described referring to FIGS. 1 to 8.

Although the first heater 220 is shown to be placed inside the substrate support 210 in FIG. 9, the embodiment is not limited thereto. For example, the first heater 220 may be placed below the substrate support 210 in a separate configuration from that of the substrate support 210.

The support shaft 230 is located below the substrate support 210 and supports the substrate support 210.

A nozzle 300 may supply a process gas to the internal space 101. The nozzle 300 may be connected to a valve 310 and a gas storage unit 320. The valve 310 may turn on/off supply of the process gas to the internal space 101 through the nozzle 300. The valve 310 may open and close the gas supply line and control a supply flow rate of the process gas. The nozzle 300 may supply the process gas stored in the gas storage unit 320 (e.g., a gas storage container) to the inside of the process chamber 100 through the gas supply hole 302. The nozzle 300 may include a plurality of gas supply holes 302.

The second heater 400 may be substantially identical to the second heater H2 described referring to FIGS. 1 to 8. The second heater 400 may be placed in the internal space 101. The second heater 400 may provide a wave energy (e.g., electromagnetic wave energy) to the substrate W to change the temperature of the substrate W. The second heater 400 may generate a wave and provide it to the substrate W. For example, the second heater 400 may provide light to the internal space 101. The second heater 400 may be connected to a second external power supply 410.

The third heater 500 may be placed in the internal space 101. The third heater 500 may provide a magnetic energy to the substrate W to change the temperature of the substrate W. The third heater 500 may generate the magnetic energy (e.g., magnetic field) and provide it to the substrate W. For example, the third heater 500 may heat the substrate W, using a magnetic guidance method (e.g., heat induction). The third heater 500 may be connected to a third external power supply 510. The temperature of the substrate W may be changed according to the energy that is lost by the magnetic energy provided by the third heater 500.

The third heater 500 may differentially heat a plurality of films formed on the substrate W. For example, when the substrate W includes a first film and a second film including different materials, the third heater 500 may differentially heat the first film and the second film. In some embodiments, when the substrate W includes a plurality of films having different materials, because the plurality of films respond to the same magnetic energy and the lost energies are different, the changing temperature may be different.

The third heater 500 generates the same magnetic energy and provides it onto the substrate W, and because the lost heat energy of the first film and the second film differs due to the magnetic energy, the temperatures of the first film and the second film may be changed differently. For example, since the reactivity of the first film and the second film with respect to the same magnetic energy is different, the degrees of temperature change of the first film and the second film may be different.

Although the semiconductor device fabricating equipment 1000 is shown to include both the second heater 400 and the third heater 500 in FIG. 9, the embodiment is not limited thereto. The semiconductor device fabricating equipment 1000 may include only one of the second heater 400 and the third heater 500. For example, the semiconductor device fabricating equipment 1000 may include the second heater 400 and may not include the third heater 500. Also, as described previously, though FIG. 9 shows the heaters being placed obliquely above the substrate W, at least one can be placed directly above the substrate W. For example, light or magnetic field producing elements of the second heater 400 and third heater 500 can be attached to a bottom of the nozzle 300.

A processor 700, e.g., similar to that described above in connection with FIGS. 3-8, may control the overall operation of the semiconductor device fabricating equipment 1000. The processor 700 may control the valve 310 to adjust the flow rate of the process gas provided by the nozzle 300 to the internal space 101. The processor 700 may control the first heater 220, the second heater 400, and the third heater 500 to change the temperature of the substrate W depending on the process.

The processor 700 may control the second heater 400 to change the frequency of the wave generated. For example, the processor 700 may control the second heater 400 to generate waves of the first frequency, so that the second heater 400 heats the first film L1 of the substrate W to a temperature higher than that of the second film L2. The processor 700 may control the second heater 400 to generate waves of the second frequency, so that the second heater 400 heats the second film L2 of the substrate W to a temperature higher than that of the first film L1. For example, according to some embodiments, for subsequent processes, the processor 700 may switch the frequency of the wave generated by the second heater 400 so that initially the first film L1 of the substrate W is matched to the frequency used to change the temperature of the first film L1, and then subsequently, the second film L2 of the substrate W is matched to the frequency used to change the temperature of the second film L2.

Figure 10:
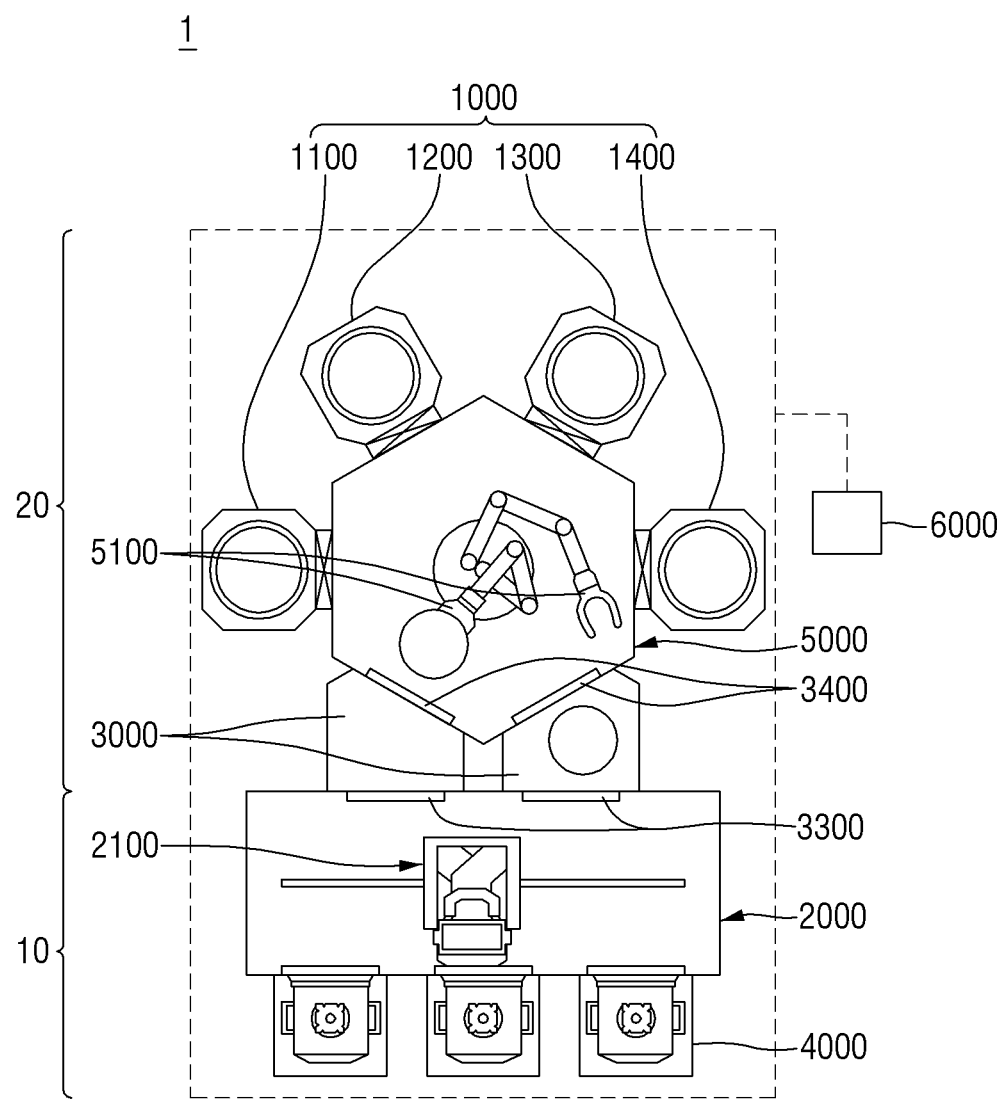
FIG. 10 is a diagram which shows a semiconductor device fabricating system that includes the fabricating equipment for the semiconductor device according to some embodiments.

FIG. 10 is a diagram which shows a semiconductor device fabricating system, from a plan view, that includes the fabricating equipment for the semiconductor device according to some embodiments.

Referring to FIG. 10, a substrate processing system 1 may include an equipment front end module 10 and a process module 20. The equipment front end module 10 may be placed on one side of the process module 20. For example, the equipment front end module 10 may be placed in front of the process module 20. The equipment front end module 10 may include a plurality of load ports 4000 and an index module 2000. The process module 20 may include a load lock chamber 3000, a semiconductor device fabricating equipment 1000, and a conveying chamber 5000.

The index module 2000 is placed between the load port 4000 and the process module 20. The index module 2000 may convey the substrate W between the load port 4000 and the process module 20. Each load port 4000 provides a space in which a container FOUP (front opening unified pod) which accommodates the substrate W is placed. The index module 2000 may include an index robot 2100. The index robot 2100 may carry out the substrate W before the process treatment from the container FOUP placed on the load port 4000 and convey it to the process module 20. Further, the index robot 2100 may carry the substrate W subjected to the process treatment into the container FOUP from the process module 20.

The process module 20 may include a conveying chamber 5000, a plurality of load lock chambers 3000, and a plurality of semiconductor device fabricating equipment 1000. The conveying chamber 5000 may have a polygonal shape in plan view. The load lock chamber 3000 and the semiconductor device fabricating equipment 1000 may be placed at each side (e.g., between two corners) of the conveying chamber 5000. The load lock chamber 3000 may be placed at a position closest to the equipment front end module 10 in between two corners of the conveying chamber 5000.

For example, the conveying chamber 5000 may have a hexagonal shape in plan view. The conveying chamber 5000 may have six corners and six sides. Four semiconductor device fabricating equipment 1000, that is, four process chambers and two load lock chambers 3000 may be placed at respective sides. The semiconductor device fabricating equipment 1000 may include a first process chamber 1100, a second process chamber 1200, a third process chamber 1300, and a fourth process chamber 1400. Though a specific example is shown, the shape of the conveying chamber 5000 and the number of the semiconductor device fabricating equipment 1000 and the load lock chamber 3000 placed to be adjacent to the conveying chamber 5000 may be changed.

The conveying chamber 5000 may include a conveying robot 5100. The conveying robot 5100 is placed inside the conveying chamber 5000. The conveying robot 5100 conveys the substrate W between the load lock chamber 3000 and the semiconductor device fabricating equipment 1000. The conveying robot 5100 may include a plurality of arms. The plurality of arms may transport and convey the substrate W, respectively. The plurality of arms may unload the substrate W stored in the load lock chamber 3000. Subsequently, a plurality of arms may grip the substrate W and convey it to the semiconductor device fabricating equipment 1000.

The load lock chamber 3000 provides a space that temporarily stores the substrate W carried in or out of the process module 20. For example, the load lock chamber 3000 may be a space in which the substrate W carried in or out of the process module 20 temporarily stays.

The interior of the load lock chamber 3000 may be switched into a vacuum and an atmospheric pressure. Accordingly, the interior of the conveying chamber 5000 and the semiconductor device fabricating equipment 1000 may be kept in a vacuum, and the interior of the equipment front end module 10 may be kept at an atmospheric pressure.

A first gate valve 3300 is installed between the load lock chamber 3000 and the equipment front end module 10. A second gate valve 3400 is installed between the load lock chamber 3000 and the conveying chamber 5000. Only one of the first gate valve 3300 and the second gate valve 3400 may be opened so that the interior of the conveying chamber 5000 and the semiconductor device fabricating equipment 1000 may maintain a vacuum.

The first to fourth process chambers 1100 to 1400 may perform a process of treating the substrate W. The first to fourth process chambers 1100 to 1400 may perform a vapor deposition process. Specifically, the first to fourth process chambers 1100 to 1400 may perform a process of depositing a thin film on the substrate W. The thin film may be a layer thinner than the example layers L1 and L2 shown in FIG. 1, and may be conformally formed on the first layer L1, as described in one example in connection with FIGS. 12-17 below. One or more of the first to fourth process chambers 1100 to 1400 may be a fabricating equipment 1000 such as shown in FIG. 9, or may be a fabricating equipment such as shown in FIG. 11, described in greater detail below.

In some embodiments, the substrate processing system 1 includes a processor 6000. The processor 6000 may control the conveying chamber 5000, the load lock chamber 3000, and the semiconductor device fabricating equipment 1000. Further, although the processor 6000 may control an operation in which the conveying robot 5100 conveys the substrate W, the embodiment is not limited thereto. The processor 6000 may be part of a control system implemented using the processor, along with control software, memory, input/output devices, and the like. For example, the processor may be part of a computer used to control the components of the substrate processing system 1.

Figure 11:
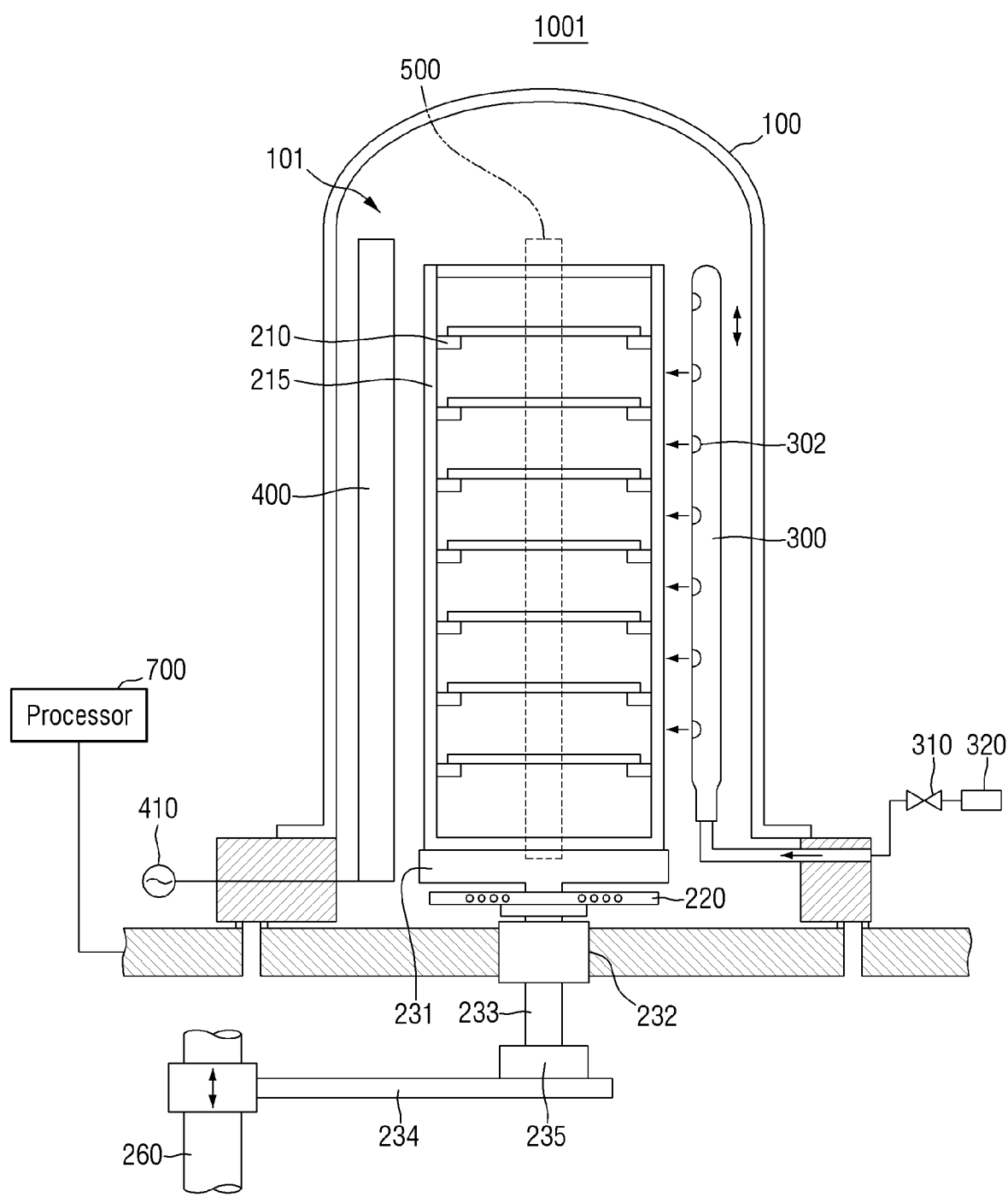
FIG. 11 is a diagram which shows the semiconductor device fabricating equipment according to some embodiments.

FIG. 11 is a diagram which shows the semiconductor device fabricating equipment according to some embodiments. Specifically, the semiconductor device fabricating equipment shown in FIG. 11 shows an arrangement facility for processing a plurality of substrates. For convenience of explanation, the points different from those described using FIG. 9 will be mainly described.

Referring to FIG. 11, a semiconductor device fabricating equipment 1001 may include a process chamber 100, a substrate support 210 (e.g., plurality of substrate supports), a nozzle 300, a first heater 220, a second heater 400, and a third heater 500.

The process chamber 100 may have a cylindrical shape with an open lower end portion. The process chamber 100 may extend vertically and define an internal space 101 for processing the substrate W. A lower end portion of the process chamber 100 may be an open end portion, and an upper end portion of the process chamber 100 may be a closed end portion.

The process chamber 100 may accommodate a boat 215 that supports a plurality of substrates W placed vertically. The boat 215 may load the plurality of substrates W to be vertically separated from each other. The boat 215 may extend parallel to and apart from the nozzle 300. The boat 215 may be located at a center inside the process chamber 100, but is not limited thereto. The boat 215 may be rotated by a rotary shaft 233.

The boat 215 may be supported on a door plate. The door plate may rise and fall to pull the boat 215 into or out of the process chamber 100. A lower end portion of the process chamber 100 may be opened and closed by the door plate. The door plate is placed below the process chamber 100 and may seal the process chamber 100. A through hole 232 may be formed at a central portion of the door plate. A table 231 that supports the boat 215 may be supported by the upper end portion of the rotary shaft 233 extending through the through hole 232. A support member is installed in the through hole 232, and may rotatably support the rotary shaft 233, while airtightness is being maintained.

The rotary shaft 233 may be connected to the first heater 220 and a drive shaft of a drive motor 235. Therefore, the boat 215 on the door plate may be supported to be rotatable inside the process chamber 100. When the process gases are injected onto the substrate W, the boat 215 may rotate at a specific speed. Further, the drive motor 235 may be provided to rise and fall by an arm 234 that rises and falls along a rising and falling support base 260.

The nozzle 300 is installed inside the process chamber 100 and may inject the process gas onto the substrate W. The nozzle 300 may extend vertically from the bottom to the top of the process chamber 100. The nozzle 300 may include a plurality of gas supply holes 302 that injects the process gas. Specifically, the nozzle 300 may include a plurality of gas supply holes 302 on the side surfaces so that the gas may be injected in a horizontal direction intersecting the vertical direction along which the nozzle 300 extends.

The first heater 220 may generally heat the substrate W by providing heat to the internal space 101 of the process chamber 100 at the lower part of the boat 215. For example, the first heater 220 may blow heated air or other heated gases into the chamber, or may be a Joule heating component. The second heater 400 may partially heat the substrate W by generating and providing a wave energy in the internal space 101. The plurality of films on the substrate W may be heated to different temperatures depending on the dielectric loss value with respect to the frequency of the wave generated by the second heater 400. The second heater 400 may be a light source, for example, providing an electromagnetic wave toward the substrates in the chamber.

The third heater 500 may extend vertically in the internal space 101. The third heater 500 may be spaced apart from the second heater 400 and the nozzle 300 at equal intervals, and extend in parallel with them.

The third heater 500 may partially heat the substrate W by generating and providing magnetic energy in the internal space 101. The plurality of films on the substrate W may be heated to different temperatures depending on the rate of loss of thermal energy with respect to the magnetic energy generated by the third heater 500.

After the second heater 400 and the third heater 500 selectively heat a part of a plurality of films included in the substrate W, the semiconductor device fabricating equipment 1001 may deposit the thin film on some films heated, using the process gas supplied from the nozzle 300.

Although the semiconductor device fabricating equipment 1001 shown in FIG. 11 is shown to include both the second heater 400 and the third heater 500, the embodiment is not limited thereto. The semiconductor device fabricating equipment 1001 may include only one of the second heater 400 and the third heater 500. For example, the semiconductor device fabricating equipment 1001 may include the second heater 400 and may not include the third heater 500. As another example, the semiconductor device fabricating equipment 1001 may include the third heater 500 and may not include the second heater 400.

The processor 700 may control the overall operation of the semiconductor device fabricating equipment 1001. The processor 700 may control the second heater 400 to change the frequency of the wave generated. For example, for the second heater 400 to heat the first film of the substrate W to a temperature higher than that of the second film, the processor 700 may control the second heater 400 to generate waves of the first frequency. For the second heater 400 to heat the second film of the substrate W to a temperature higher than that of the first film, the processor 700 may control the second heater 400 to generate waves of the second frequency.

Although FIG. 11 shows the second heater 400 and third heater 500 in a rod shape extending in the vertical direction, the embodiment is not limited thereto. For example, the second heater 400 and the third heater 500 may have a circular shape placed around the inner wall of the process chamber 100.

Although FIG. 11 shows that the second heater 400 and the third heater 500 are placed one by one, the embodiment is not limited thereto. For example, in the second heater 400, a plurality of heater units extending in the vertical direction to surround the circumference of the boat 215 may be placed.

FIGS. 12 to 17 are diagrams for explaining a method for fabricating a semiconductor device according to some embodiments. For reference, FIGS. 12 to 17 are exemplary diagrams for explaining a method for fabricating a semiconductor device, and the method for fabricating the semiconductor device is not limited thereto.

Figure 12:
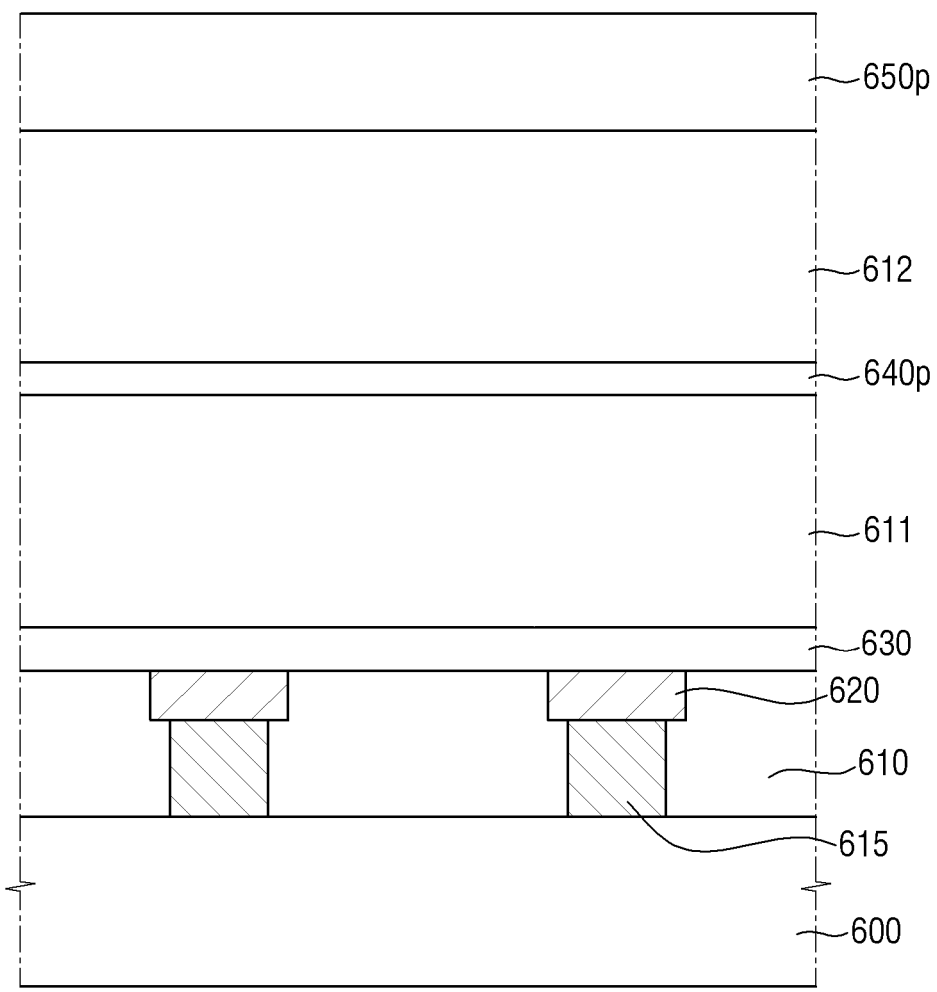
FIGS. 12 to 17 are diagrams for explaining a method for fabricating a semiconductor device according to some embodiments.

Referring to FIG. 12, various components are included in semiconductor device being fabricated. For example, a storage contact 615 and a landing pad 620 may be formed inside an interlayer insulating film 610 on a substrate 600.

An etching stop film 630, a lower mold film 611, a lower supporter film 640$p$, an upper mold film 612, and an upper supporter film 650$p$ may be sequentially formed on the interlayer insulating film 610.

Figure 13:
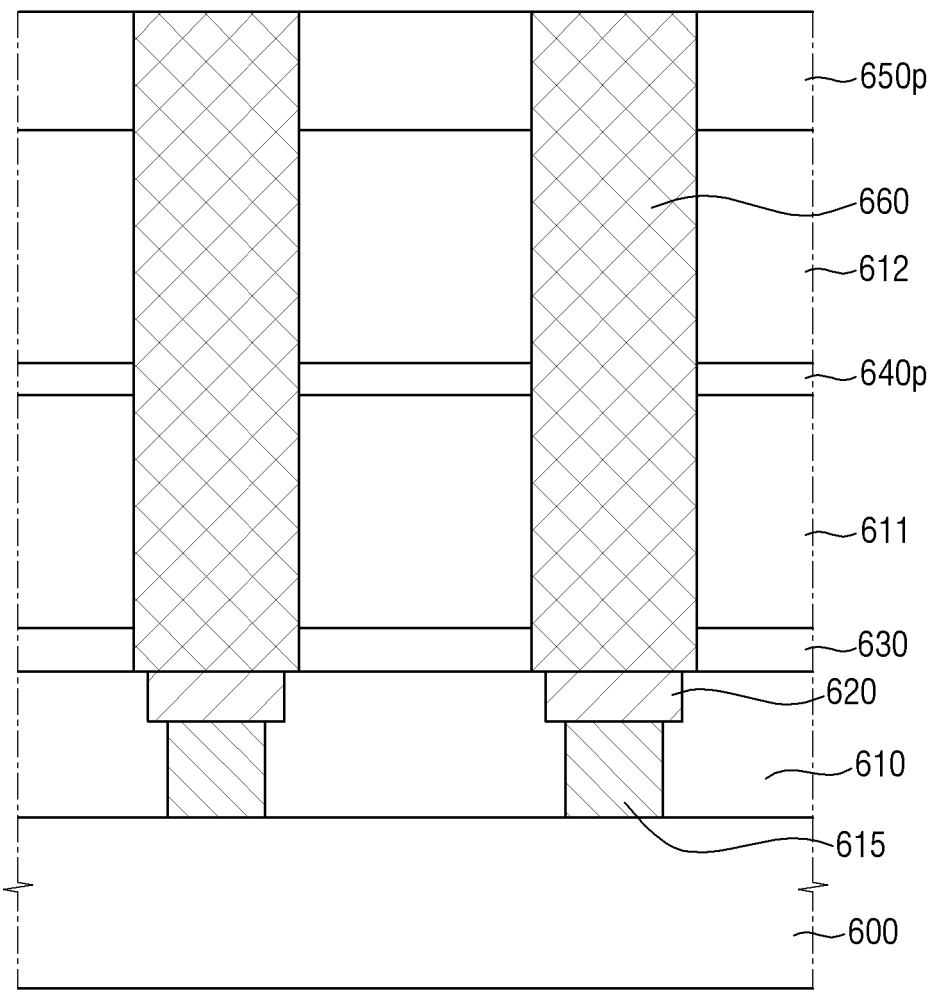

Referring to FIG. 13, a lower electrode 660 that penetrates the etching stop film 630, the lower mold film 611, the lower supporter film 640$p$, the upper mold film 612 and the upper supporter film 650$p$ may be formed on the landing pad 620. The different films, as well as other components, may be described as layers—e.g., a lower support layer, an upper mold layer, a lower electrode layer, etc. Also, the different components may be part of an integrated circuit that forms a semiconductor chip, such as a memory chip, and may be described as integrated circuit components.

Figure 14:
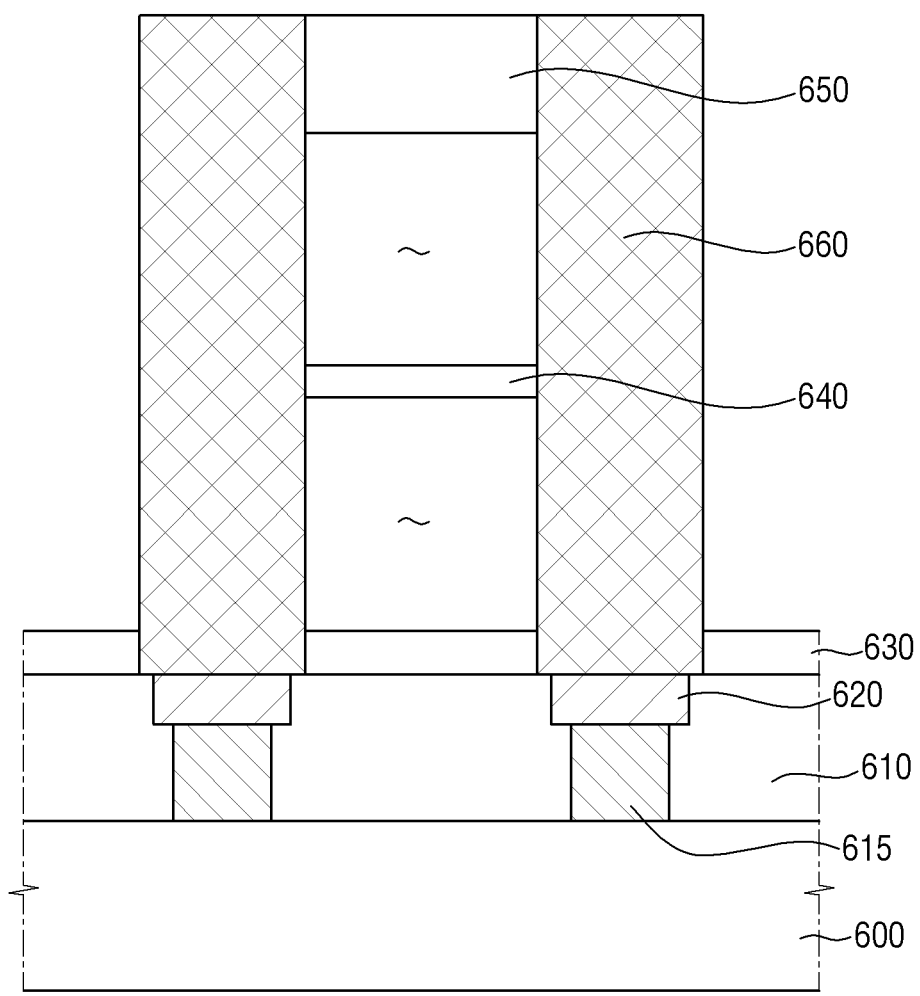

Referring to FIG. 14, an upper supporter pattern 650 and a lower supporter pattern 640 that connect adjacent lower electrodes 660 may be formed. The upper supporter pattern 650 and the lower supporter pattern 640 may each come into contact with a part of the side walls of the lower electrode 660. The term "contact" as used here, refers to a direct connection, i.e., touching.

A part of the upper supporter film 650$p$ may be removed to form the upper supporter pattern 650. The upper mold film 612 may be removed through the region in which the upper supporter pattern 650 is not formed.

Subsequently, a part of the lower supporter film 640$p$ may be removed to form the lower supporter pattern 640. The lower mold film 611 may be removed through the region in which the lower supporter pattern 640 is not formed.

Accordingly, a space may be formed between the upper supporter pattern 650 and the lower supporter pattern 640, and between the lower supporter pattern 640 and the etching stop film 630.

Figure 15:
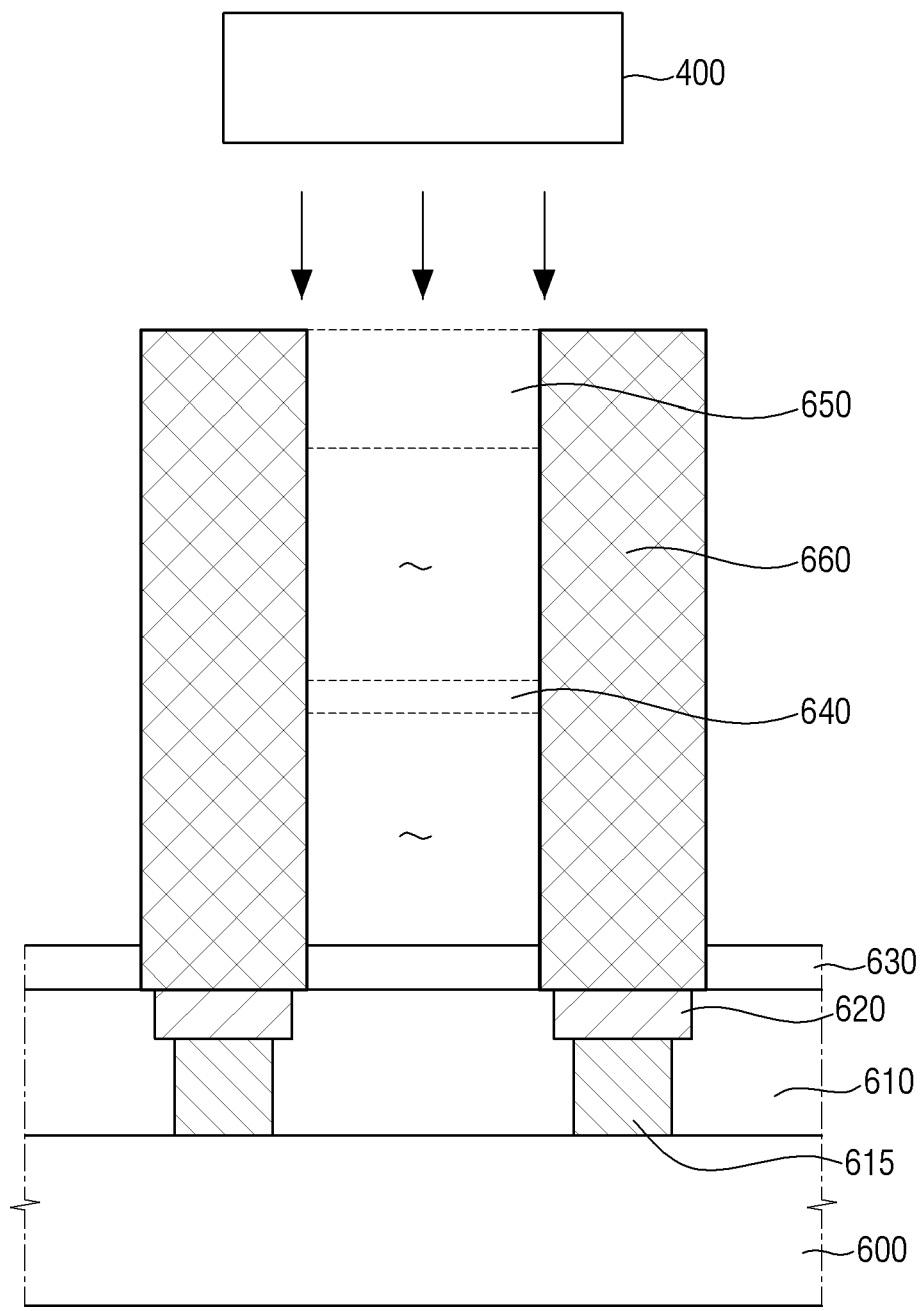

Referring to FIG. 15, the lower electrode 660 may be heated, using the second heater 400. Specifically, when the second heater 400 generates and provides a wave, the dielectric loss value of the lower electrode 660 with respect to the frequency of the wave generated by the second heater 400 is large, and the dielectric loss value of the upper supporter pattern 650 and the lower supporter pattern 640 is relatively small. Therefore, the temperature of the lower electrode 660 may become higher than the temperatures of the upper supporter pattern 650 and the lower supporter pattern 640, in response to the wave generated by the second heater 400.

Figure 16:
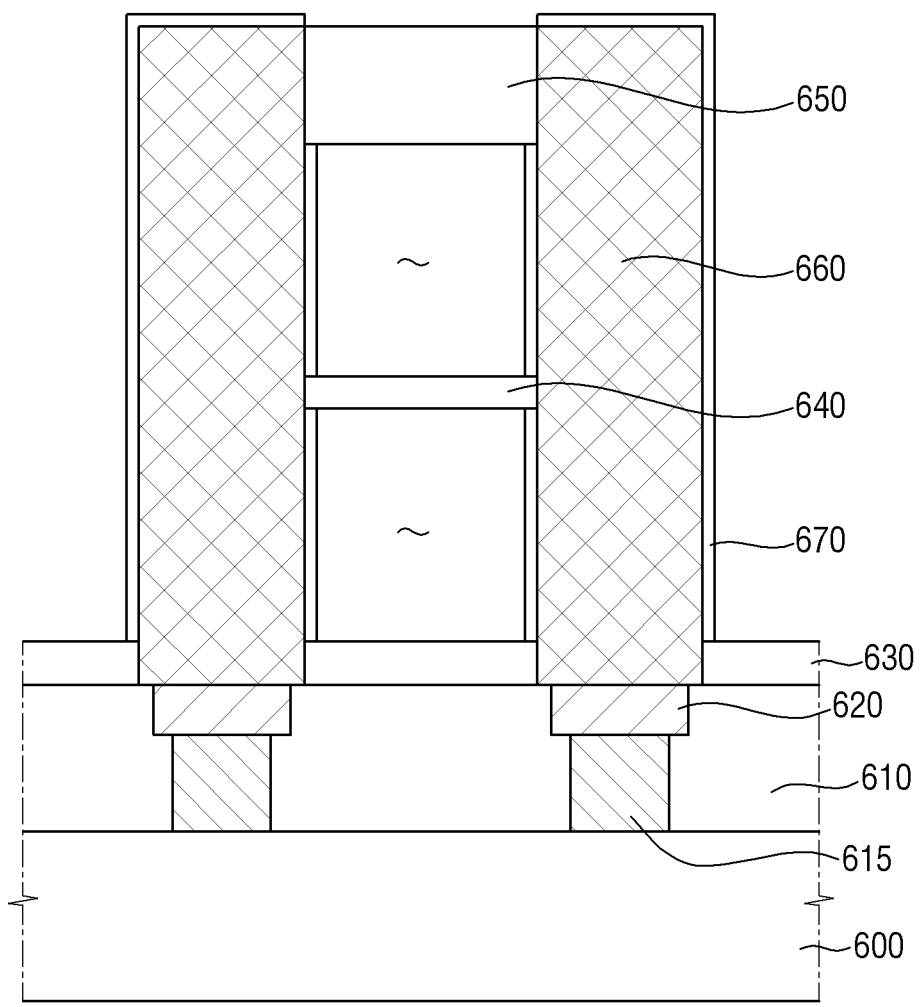

Referring to FIG. 16, a capacitor dielectric film 670 is deposited. Specifically, the capacitor dielectric film 670 is formed on the lower electrode 660 having a relatively high temperature. The capacitor dielectric film 670 is not formed on the upper supporter pattern 650 and the lower supporter pattern 640, which have relatively low temperatures. The capacitor dielectric film 670 may be deposited along the profile of the lower electrode 660 except for the upper supporter pattern 650 and the lower supporter pattern 640.

Figure 17:
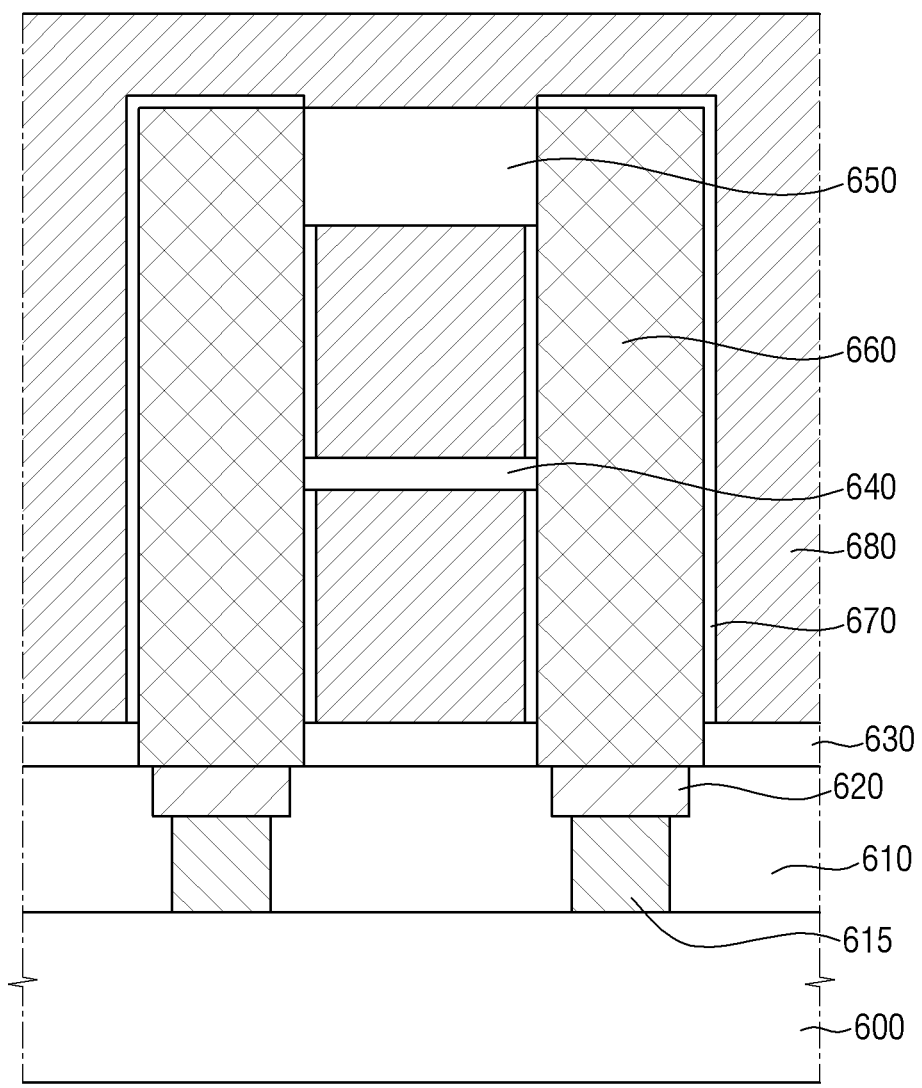

Referring to FIG. 17, an upper electrode 680 is formed. The upper electrode 680 may be formed on the upper supporter pattern 650, the capacitor dielectric film 670, the upper supporter pattern 650, the lower supporter pattern 640, and the etching stop film 630. The upper electrode 680 may be formed in the space between the upper supporter pattern 650 and the lower supporter pattern 640 from which the upper mold film 612 is removed. Accordingly, the upper electrode 680 may fill the space between the upper supporter pattern 650 and the lower supporter pattern 640.

Similarly, the upper electrode 680 may be formed in the space between the lower supporter pattern 640 and the etching stop film 630 from which the lower mold film 611 is removed. The upper electrode 680 may fill the space between the lower supporter pattern 640 and the etching stop film 630.

FIGS. 12 to 17 show that in the method for fabricating a capacitor of a volatile memory, the temperature of the lower electrode 660 is heated to be higher than the temperature of the upper supporter pattern 650 and the lower supporter pattern 640, using the second heater 400, thereby selectively depositing the capacitor dielectric film 670 only on the lower electrode 660 (e.g., only on the desired components). However, this is for the purpose of explaining the selective deposition using the second heater 400, and the embodiment is not limited thereto. For example, the selective deposition using the second heater 400 may also be used in a method for fabricating a non-volatile memory. Subsequent to the steps shown in FIGS. 12-17, additional steps in the fabrication process may be carried out, to form a completed semiconductor device. For example, a memory chip such as a DRAM chip may be formed by completing deposition of various layers on the substrate, and singulating chips on a wafer from each other. Each memory chip may be further packaged into a semiconductor package, including, for example, a package substrate, one or more memory chips stacked thereon, and an encapsulation layer covering the package substrate and the one or more memory chips.

According to the apparatus and method described above, it is possible to perform deposition of a thin film on a selected layer, film, or component of an integrated circuit by using a light or magnetic field, without the need for separately controlled heating elements within a chuck or substrate support, and without the need for a precursor gas, etching, or an extensive cleaning process afterward.

In concluding the detailed description, those skilled in the art will appreciate that many variations and modifications may be made to the preferred embodiments without substantially departing from the principles of the present invention. Therefore, the disclosed preferred embodiments of the invention are used in a generic and descriptive sense only and not for purposes of limitation.

What is claimed is:

1. A method for fabricating a semiconductor device, the method comprising:
   providing a substrate on which a first layer having a maximum dielectric loss value at a first frequency and a second layer having a maximum dielectric loss value at a second frequency different from the first frequency are formed;
   providing waves of the first frequency from a heater to the substrate to heat a temperature of the first layer to be higher than the temperature of the second layer;
   while the temperature of the first layer is higher than the temperature as a result of the heating of the second layer, forming a third layer, which is thinner than the first layer and is thinner than the second layer, on the heated first layer and not on the second layer,
   providing, from the heater, waves of a second frequency different from the first frequency to the substrate to heat the temperature of the second layer to be higher than the temperature of the first layer; and
   while the temperature of the second layer is higher than the temperature of the first layer as a result of the heating, forming a fourth layer thinner than the first layer and thinner than the second layer on the heated second layer and not on the first layer.

2. The method of claim 1, wherein the heater is a light source that provides light to the first layer and the second layer.

3. The method of claim 1, wherein the first layer is a conductive layer, and the second layer is an insulating layer.

4. The method of claim 3, wherein the conductive layer is a capacitor electrode having an exposed side surface and an exposed top surface, and the third layer is formed on the exposed side surface and the exposed top surface.

5. The method of claim 4, wherein the semiconductor device is a DRAM chip.

6. The method of claim 1, wherein the third layer is a thin film deposited using a process gas.

7. The method of claim 1, wherein the heater is a second heater, and further comprising:
   heating the substrate with a first heater disposed below the substrate; and
   forming the third layer as part of a temperature-dependent selective deposition in a process chamber including an internal space to which the waves are propagated.

8. The method of claim 7, wherein the first heater is a heater that uses a Joule heating method.

9. A method for fabricating a semiconductor device by using temperature-dependent selective deposition in a process chamber including an internal space, a first heater, and a second heater, the method comprising:
   providing a substrate on a substrate support in the process chamber;

forming a first integrated circuit component on the substrate, the first integrated circuit component formed of a first material;

forming a second integrated circuit component on the substrate, the second integrated circuit component formed of a second material;

applying heat from the first heater to the first integrated circuit component and second integrated circuit component simultaneously;

providing at least one of an electromagnetic wave and a magnetic field from the second heater to the first integrated circuit component and the second integrated circuit component simultaneously, to heat a temperature of the first integrated circuit component to be higher than the temperature of the second integrated circuit component; and depositing a layer on the first integrated circuit component having the higher temperature, wherein the first integrated circuit component is formed of a conductive material, and the second integrated circuit component is formed of an insulating material.

10. The method of claim 9, wherein the first integrated circuit component is an electrode of a capacitor and the second integrated circuit component is a supporter film connected to the electrode.

11. The method of claim 10, wherein the semiconductor device is a DRAM chip.

12. The method of claim 9, wherein providing at least one of an electromagnetic wave and a magnetic field from the second heater includes providing light having a wavelength that causes the first integrated circuit component to increase in temperature more than the second integrated circuit component.

13. The method of claim 9, wherein the first heater is below the substrate support, and the second heater is spaced apart from the substrate support.

14. The method of claim 9, wherein the first heater is a heater that uses a Joule heating method.

15. A method for fabricating a semiconductor device by using temperature-dependent selective deposition in a process chamber including an internal space and a heater, the method comprising:

providing a substrate on a substrate support in the process chamber;

forming electrodes on the substrate and forming a supporter film between the electrodes and supporting the electrodes on the substrate;

providing at least one of an electromagnetic wave and a magnetic field from the heater to the electrodes and the supporter film simultaneously, to heat a temperature of the electrodes to be higher than the temperature of the supporter film; and using a process gas, depositing a layer along surfaces of the electrodes having the higher temperature resulting from the heating, and not depositing the layer along surfaces of the supporter film.

16. The method of claim 15, wherein the electrodes are capacitor electrodes.

* * * * *